(12) United States Patent
Mezheritsky et al.

(10) Patent No.: US 9,295,923 B2
(45) Date of Patent: Mar. 29, 2016

(54) TRANSDUCER FOR ULTRASONIC FLOW METER

(71) Applicant: Daniel Measurement and Control, Inc., Houston, TX (US)

(72) Inventors: Alex Mezheritsky, Houston, TX (US); Charles Robert Allen, Houston, TX (US)

(73) Assignee: DANIEL MEASUREMENT AND CONTROL, INC., Houston, TX (US)

( * ) Notice: Subject to any disclaimer, the term of this patent is extended or adjusted under 35 U.S.C. 154(b) by 86 days.

(21) Appl. No.: 14/220,294

(22) Filed: Mar. 20, 2014

(65) Prior Publication Data
US 2015/0268077 A1 Sep. 24, 2015

(51) Int. Cl.
*G01F 1/66* (2006.01)
*B01B 1/00* (2006.01)

(52) U.S. Cl.
CPC . *B01B 1/00* (2013.01); *G01F 1/662* (2013.01); *G01F 1/667* (2013.01)

(58) Field of Classification Search
CPC .............. G01F 1/20; G01F 1/66; F04R 25/00
USPC ............................ 73/861.28, 861.18; 381/151
See application file for complete search history.

(56) References Cited

U.S. PATENT DOCUMENTS

| | | | |
|---|---|---|---|
| 4,652,702 A * | 3/1987 | Yoshii | 381/151 |
| 4,823,041 A | 4/1989 | Inoue et al. | |
| 5,020,035 A | 5/1991 | Kompanek | |
| 2010/0257942 A1 | 10/2010 | Straub et al. | |
| 2011/0162462 A1* | 7/2011 | Allen | 73/861.18 |

OTHER PUBLICATIONS

International Application No. PCT/US2015/019137 Search Report and Written Opinion dated Jun. 10, 2015 (14 pages).

* cited by examiner

*Primary Examiner* — Jewel V Thompson
(74) *Attorney, Agent, or Firm* — Conley Rose, P.C.

(57) ABSTRACT

An ultrasonic transducer suitable for use in ultrasonic metering of fluids at extreme temperatures. The ultrasonic transducer includes a piezoelectric crystal, low-density epoxy encasing the piezoelectric crystal, and a cylindrical reinforcing sleeve embedded in the low-density epoxy. The sleeve includes fiber mesh, and surrounds the piezoelectric crystal.

18 Claims, 5 Drawing Sheets

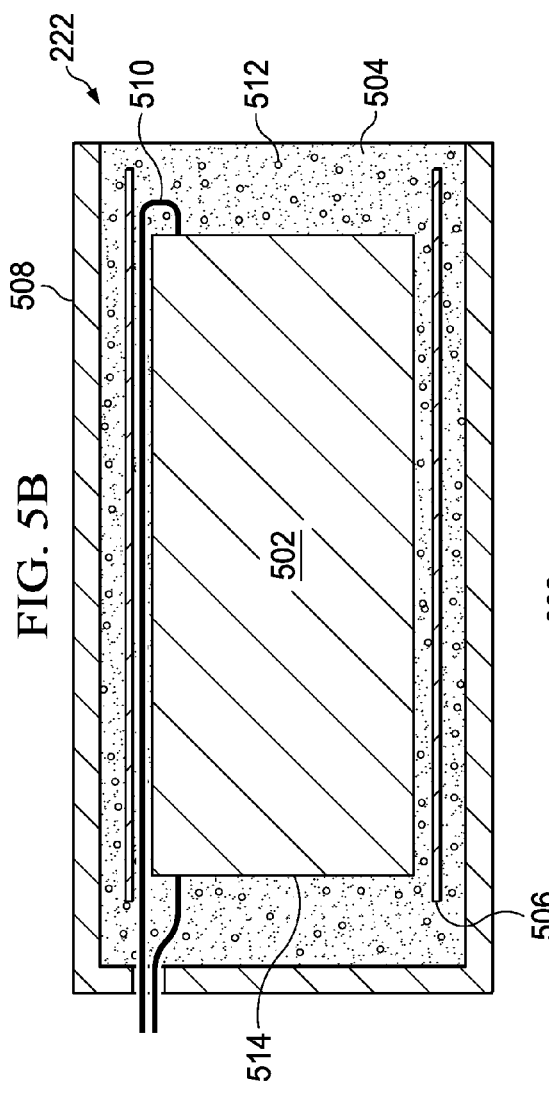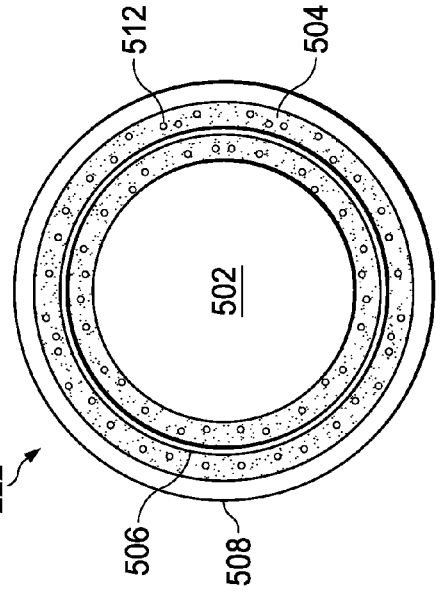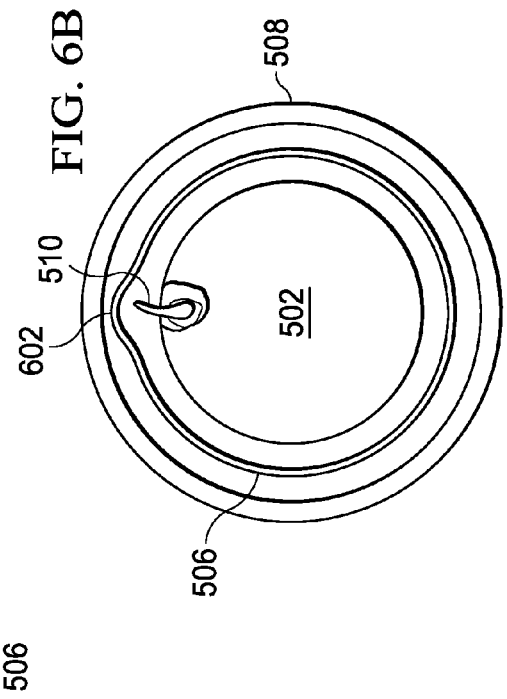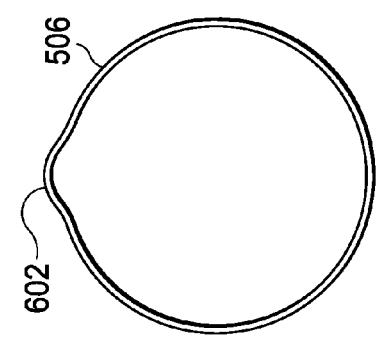
FIG. 5B
FIG. 6B
FIG. 5A
FIG. 6A

TRANSDUCER FOR ULTRASONIC FLOW METER

BACKGROUND

Fluids, such as natural gas, are transported from place-to-place via pipelines. It is desirable to know with accuracy the amount of fluid flowing in the pipeline, and particular accuracy is demanded when the fluid is changing hands, or "custody transfer." Even where custody transfer is not taking place, however, measurement accuracy is desirable, and in these situations flow meters may be used.

Ultrasonic flow meters are one type of flow meter that may be used to measure the amount of fluid flowing in a pipeline. Ultrasonic flow meters have sufficient accuracy to be used in custody transfer. In an ultrasonic flow meter, acoustic signals are sent back and forth across the fluid stream to be measured. Based on parameters of received acoustic signals, the fluid flow velocity in the flow meter is determined. The volume of fluid flowing through the meter can be determined from computed flow velocities and the known cross-sectional area of the flow meter. The ultrasonic flow meter includes transducers that generate and detect the acoustic signals.

SUMMARY

An ultrasonic transducer suitable for use in measuring fluid flow in extreme temperature environments using an ultrasonic flow meter is disclosed herein. In one embodiment, an ultrasonic flow meter includes a central passage for flow of a fluid stream to be metered, and a plurality of pairs of ultrasonic transducers. Each pair of transducers is configured to form a chordal path across the passage between the transducers. Each transducer includes a piezoelectric crystal, low-density epoxy encasing the piezoelectric crystal, and a cylindrical reinforcing sleeve embedded in the low-density epoxy. The sleeve includes fiber mesh, and surrounds the piezoelectric crystal.

In another embodiment, an ultrasonic transducer includes a piezoelectric crystal, low-density epoxy encasing the piezoelectric crystal, and a cylindrical reinforcing sleeve embedded in the low-density epoxy. The reinforcing sleeve includes fiber mesh, and surrounds the piezoelectric crystal.

In a further embodiment, an ultrasonic transducer includes an electrical/acoustical transducer, low-density epoxy encasing the electrical/acoustical transducer crystal, and a braided fiberglass reinforcing sleeve. The low-density epoxy is impregnated with glass bubbles. The braided fiberglass reinforcing sleeve is embedded in the low-density epoxy and surrounds the electrical/acoustical transducer.

BRIEF DESCRIPTION OF THE DRAWINGS

For a detailed description of exemplary embodiments of the invention, reference will now be made to the accompanying drawings in which:

FIGS. 5A and 5B show views of an ultrasonic transducer in accordance with principles disclosed herein; and FIGS. 6A and 6B show a reinforcing sleeve that includes a longitudinal ridge in accordance with principles disclosed herein.

NOTATION AND NOMENCLATURE

Figure 1:
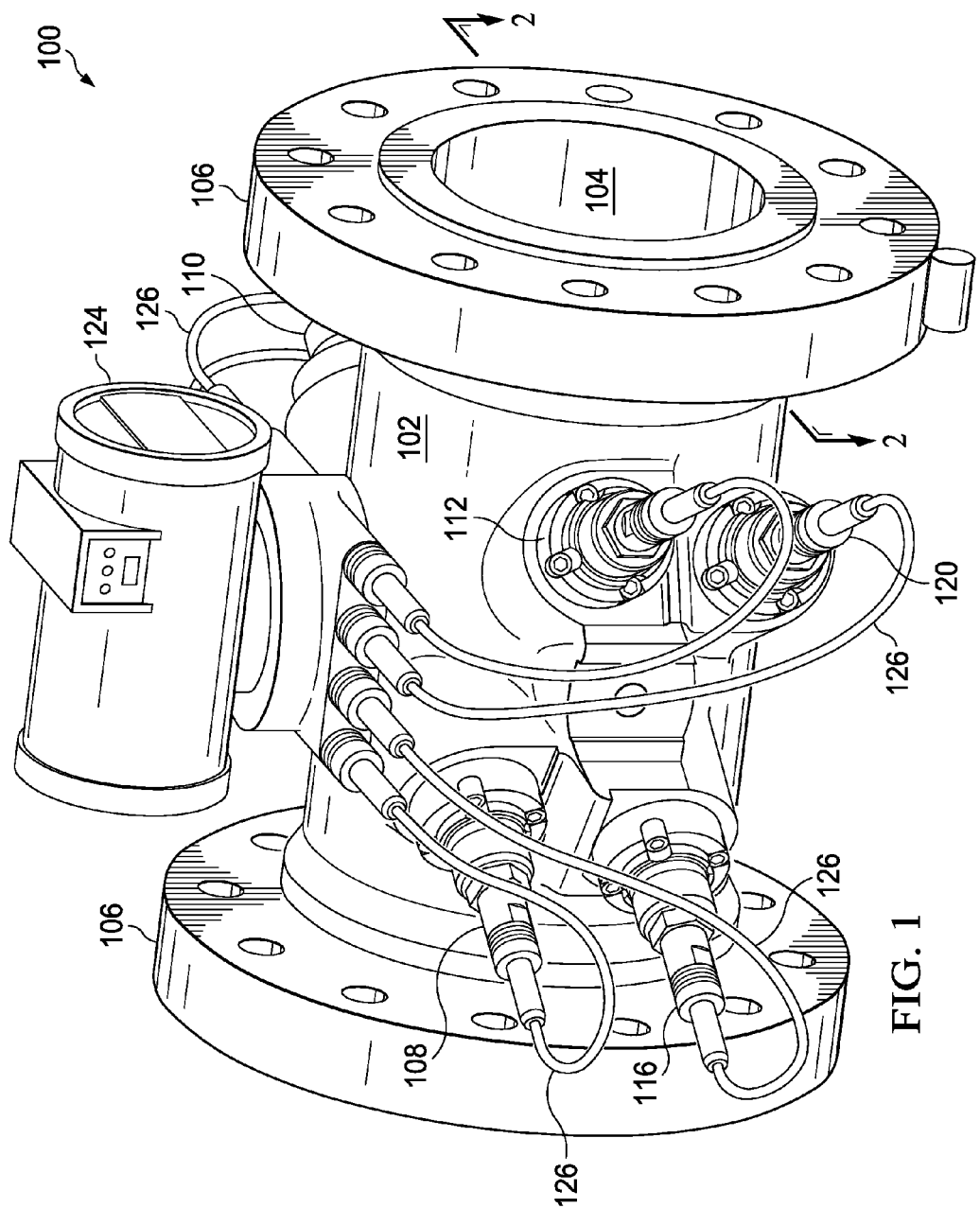
FIG. 1 shows an ultrasonic flow meter in accordance with principles disclosed herein.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " In addition, the term "couple" or "couples" is intended to mean either an indirect or a direct electrical connection. Thus, if a first device couples to a second device, that connection may be through a direct electrical connection, or through an indirect electrical connection via other devices and connections. The recitation "based on" is intended to mean "based at least in part on." Therefore, if X is based on Y, X may be based on Y and any number of other factors.

DETAILED DESCRIPTION

The following description is directed to various embodiments of the invention. The drawing figures are not necessarily to scale. Certain features of the embodiments may be shown exaggerated in scale or in somewhat schematic form and some details of conventional elements may not be shown in the interest of clarity and conciseness. The disclosed embodiments should not be interpreted, or otherwise used, to limit the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment. It is to be fully recognized that the different teachings of the embodiments discussed below may be employed separately or in any suitable combination to produce desired results. Further, the various embodiments were developed in the context of measuring hydrocarbon flows (e.g., crude oil, natural gas), and the description follows from the developmental context; however, the systems and methods described are equally applicable to measurement of any fluid flow.

Metering fluid flow in extreme temperature environments presents numerous challenges. In ultrasonic flow meters, the transducers may be exposed to the fluid flow. Extreme temperatures can physically damage and/or destroy the transducers. Embodiments of the transducer disclosed herein include structural reinforcements that enable reliable operation of the transducers in extreme temperature environments. As a result, ultrasonic meters employing embodiments of the transducer can be applied to reliably measure fluid flows in harsh temperature environments, such as cryogenic fluid flows.

FIG. 1 shows an ultrasonic flow meter 100 in accordance with principles disclosed herein. The ultrasonic flow meter 100 includes a meter body or spool piece 102 that defines a central passage or bore 104. The spool piece 102 is designed and constructed to be coupled to a pipeline or other structure (not shown) carrying fluids (e.g., natural gas) such that the fluids flowing in the pipeline travel through the central bore 104. While the fluids travel through the central bore 104, the ultrasonic flow meter 100 measures the flow rate (hence, the fluid may be referred to as the measured fluid). The spool piece 102 includes flanges 106 that facilitate coupling of the spool piece 102 to another structure. In other embodiments, any suitable system for coupling the spool piece 102 to a structure may be equivalently used (e.g., weld connections).

In order to measure fluid flow within the spool piece 102, the ultrasonic flow meter 100 includes a plurality of transducer assemblies. In the view of FIG. 1 five such transducers assembles 108, 110, 112, 116 and 120 are in full or partial view. The transducer assemblies are paired (e.g., transducer assemblies 108 and 110), as will be further discussed below. Moreover, each transducer assembly electrically couples to control electronics package 124. More specifically, each transducer assembly is electrically coupled to the control electronics package 124 by way of a respective cable 126 or equivalent signal conducting assembly.

Figure 2:
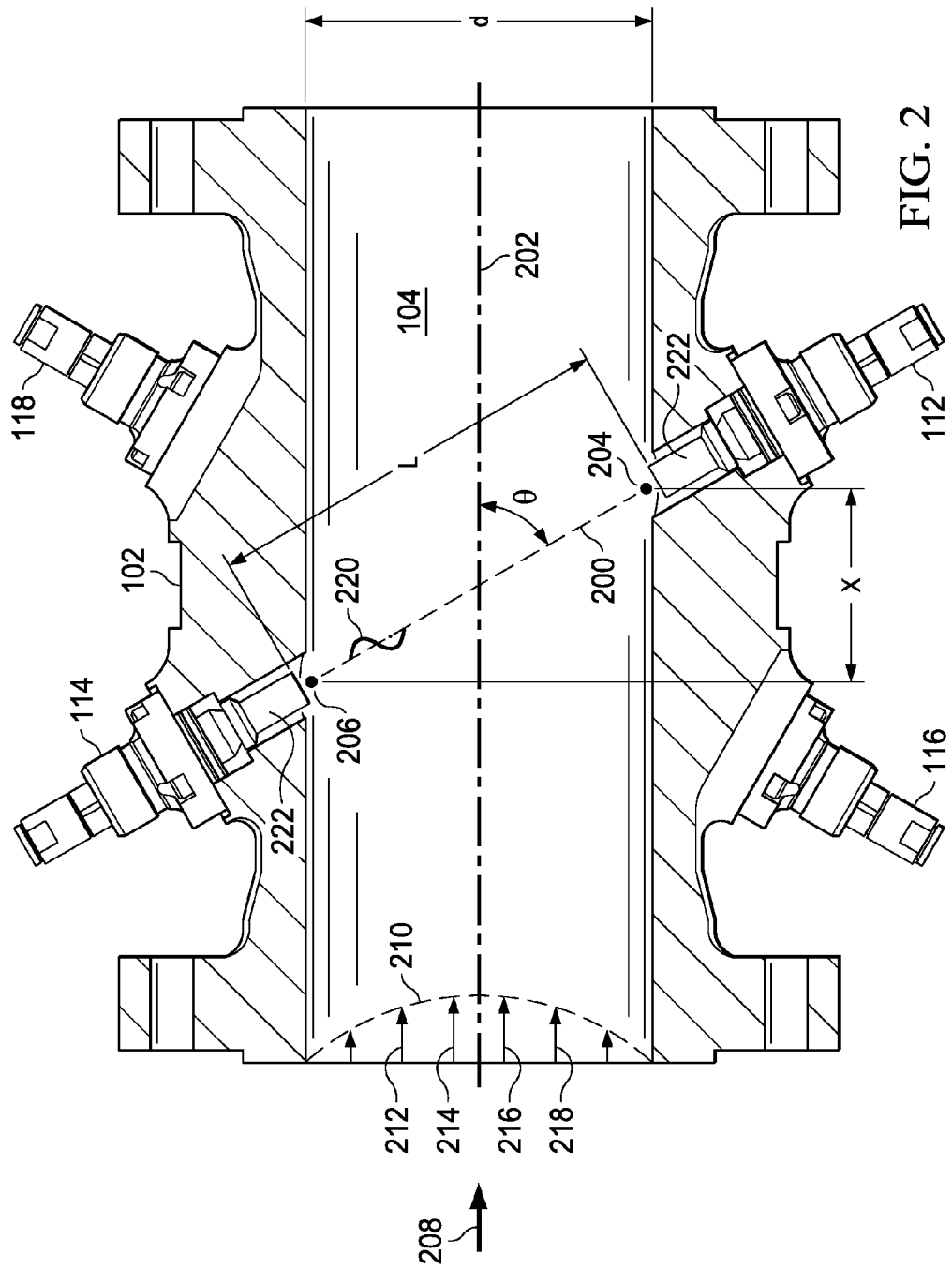
FIG. 2 shows a cross-sectional overhead view of an ultrasonic flow meter in accordance with principles disclosed herein.

FIG. 2 shows a cross-sectional overhead view of the ultrasonic flow meter 100 taken substantially along line 2-2 of FIG. 1. Spool piece 102 has a predetermined size and defines the central bore 104 through which the measured fluid flows. An illustrative pair of transducer assemblies 112 and 114 is located along the length of spool piece 102. Transducer assemblies 112 and 114 include acoustic transceivers, and more particularly include ultrasonic transducers 222 operating alternately as a transmitter and receiver. The ultrasonic transducers 222 both generate and receive acoustic signals having frequencies above about 20 kilohertz.

The acoustic signals may be generated and received by a piezoelectric element in each transducer. To generate an ultrasonic signal, the piezoelectric element is stimulated electrically by way of a signal (e.g., a sinusoidal signal), and the element responds by vibrating. The vibration of the piezoelectric element generates the acoustic signal that travels through the measured fluid to the corresponding transducer assembly of the pair. Similarly, upon being struck by an acoustic signal, the receiving piezoelectric element vibrates and generates an electrical signal (e.g., a sinusoidal signal) that is detected, digitized, and analyzed by the electronics associated with the flow meter 100 (e.g., the control electronics 124).

A path 200, also referred to as a "chord," exists between illustrative transducer assemblies 112 and 114 at an angle $\theta$ to a central bore centerline 202. The length of chord 200 is the distance between the face of transducer assembly 112 and the face of transducer assembly 114. Points 204 and 206 define the locations where acoustic signals generated by transducer assemblies 112 and 114 enter and leave fluid flowing through the spool piece 102. The position of transducer assemblies 112 and 114 may be defined by the angle $\theta$, by a first length L measured between the faces of the transducer assemblies 112 and 114, a second length X corresponding to the axial distance between points 204 and 206, and a third length d corresponding to the pipe inside diameter. In most cases distances d, X, and L are precisely determined during flow meter fabrication. A measured fluid, such as natural gas, flows in a direction 208 with a velocity profile 210. Velocity vectors 212, 214, 216 and 218 illustrate that the gas velocity through spool piece 102 increases toward the centerline 202 of the spool piece 102.

Initially, downstream transducer assembly 112 generates an ultrasonic signal that is incident upon, and thus detected by, upstream transducer assembly 114. Some time later, the upstream transducer assembly 114 generates a return ultrasonic signal that is subsequently incident upon, and detected by, the downstream transducer assembly 112. Thus, the transducer assemblies exchange or play "pitch and catch" with ultrasonic signals 220 along chordal path 200. During operation, this sequence may occur thousands of times per minute.

The transit time of an ultrasonic signal 220 between illustrative transducer assemblies 112 and 114 depends in part upon whether the ultrasonic signal 220 is traveling upstream or downstream with respect to the fluid flow. The transit time for an ultrasonic signal traveling downstream (i.e., in the same direction as the fluid flow) is less than its transit time when traveling upstream (i.e., against the fluid flow). The upstream and downstream transit times can be used to calculate the average velocity along the signal path, and the speed of sound in the measured fluid. Given the cross-sectional measurements of the flow meter 100 carrying the fluid, the average velocity over the area of the central bore 104 may be used to find the volume of fluid flowing through the spool piece 102.

Figure 3:
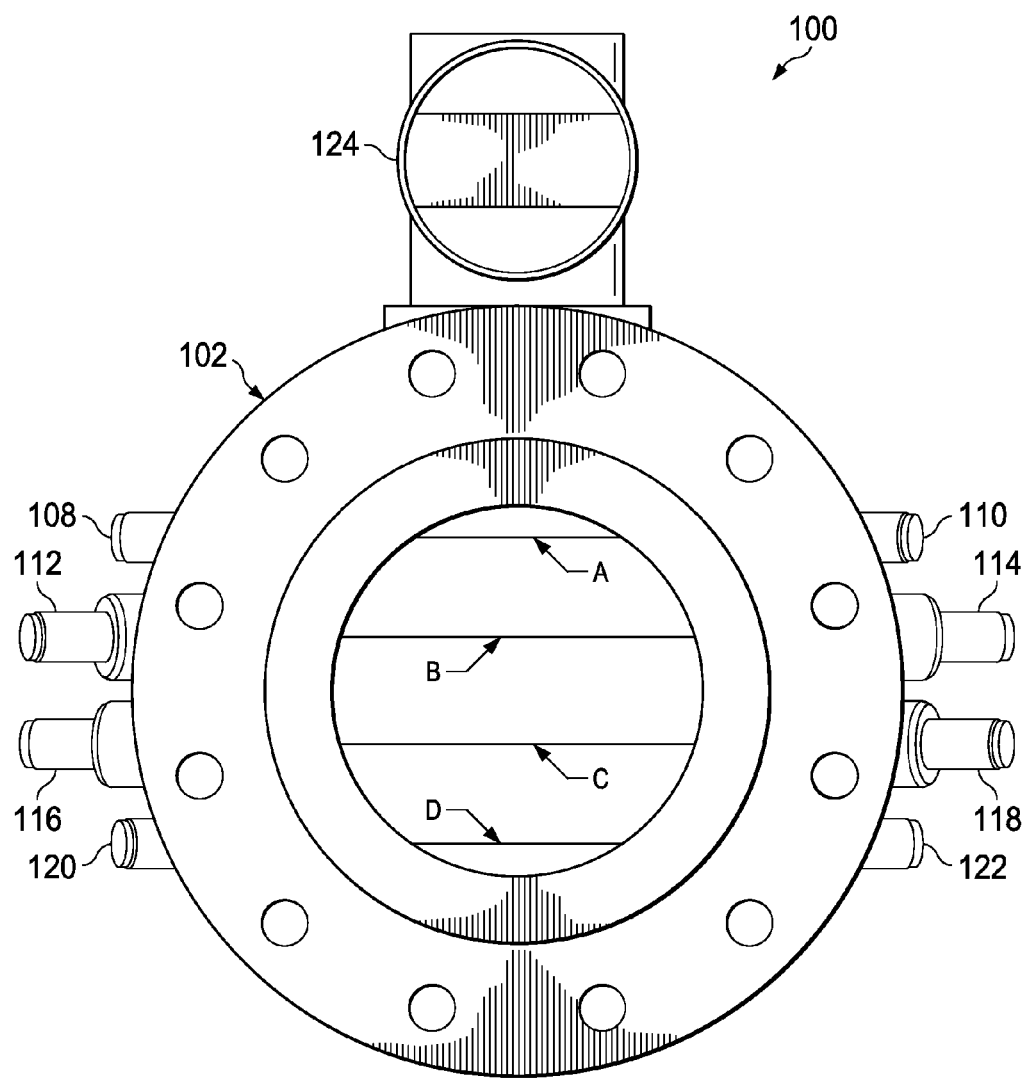
FIG. 3 shows an end elevation view of an ultrasonic flow meter in accordance with principles disclosed herein.

Ultrasonic flow meters can have one or more chords. FIG. 3 illustrates an end elevation view of ultrasonic flow meter 100. In particular, illustrative ultrasonic flow meter 100 comprises four chordal paths A, B, C and D at varying elevations within the spool piece 102. Each chordal path A-D corresponds to a transducer pair operating alternately as a transmitter and receiver. Transducer assemblies 108 and 110 (only partially visible) make up chordal path A. Transducer assemblies 112 and 114 (only partially visible) make up chordal path B. Transducer assemblies 116 and 118 (only partially visible) make up chordal path C. Finally, transducer assemblies 120 and 122 (only partially visible) make up chordal path D.

Figure 4:
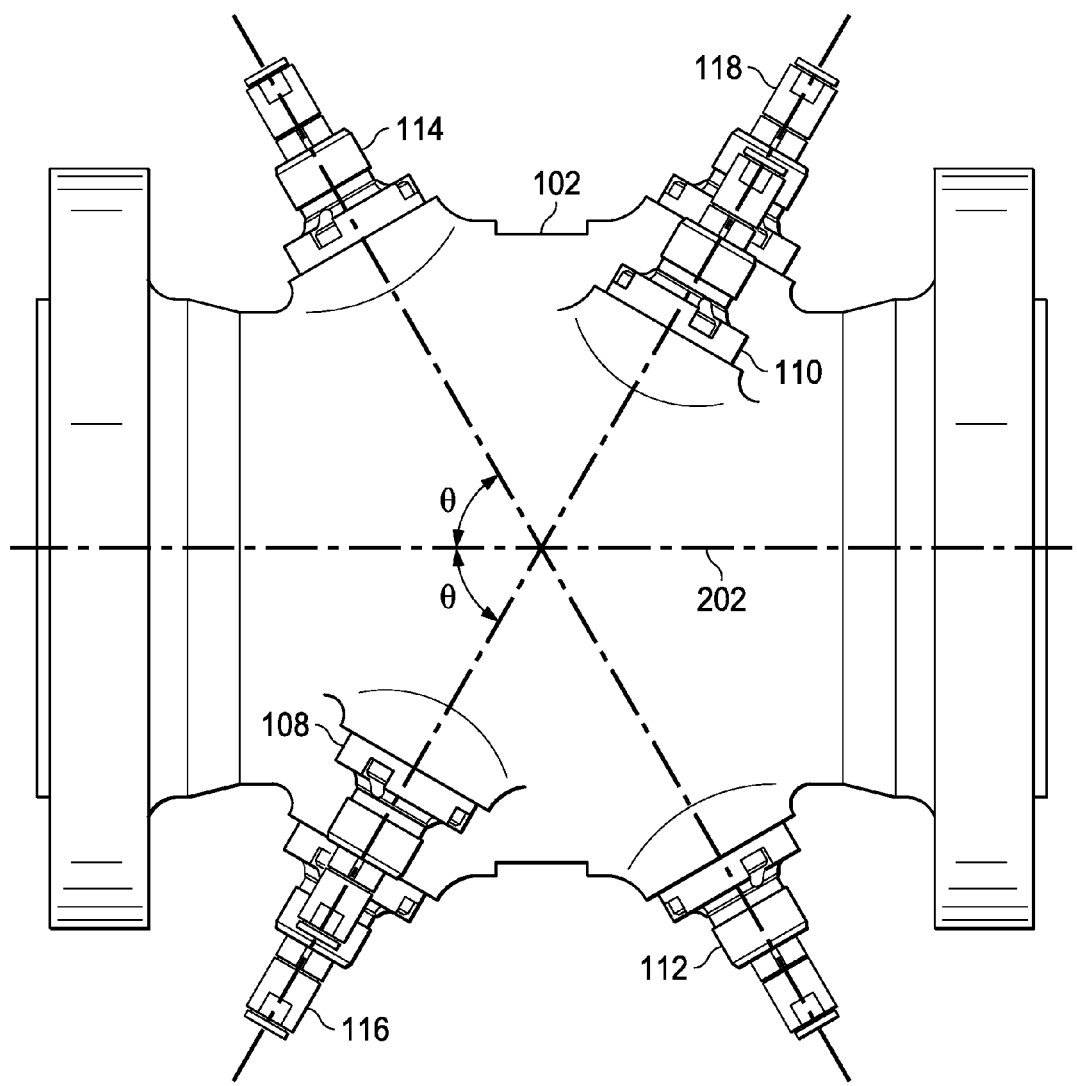
FIG. 4 shows an arrangement of transducer pairs of an ultrasonic flow meter in accordance with principles disclosed herein.

A further aspect of the arrangement of the four pairs of transducer assemblies is shown with respect to FIG. 4, which shows an overhead view. Each transducer assembly pair corresponds to a single chordal path of FIG. 3; however, the transducer assemblies are mounted at a non-perpendicular angle to the center line 202. For example, a first pair of transducer assemblies 108 and 110 is mounted at a non-perpendicular angle $\theta$ to centerline 202 of spool piece 102. Another pair of transducer assemblies 112 and 114 is mounted so that the chordal path loosely forms the shape of an "X" with respect to the chordal path of transducer assemblies 108 and 110. Similarly, transducer assemblies 116 and 118 are placed parallel to transducer assemblies 108 and 110, but at a different "level" or elevation. Not explicitly shown in FIG. 4 is the fourth pair of transducer assemblies (i.e., transducer assemblies 120 and 122). Considering FIGS. 2, 3 and 4, the transducer assembly pairs may be arranged such that the upper two pairs of transducer assemblies corresponding to chords A and B form an the shape of an "X", and the lower two pairs of transducer assemblies corresponding to chords C and D also form the shape of an "X". The flow velocity of the fluid may be determined at each chord A-D to obtain chordal flow velocities, and the chordal flow velocities are combined to determine an average flow velocity over the entire pipe. From the average flow velocity, the amount of fluid flowing in the spool piece, and thus the pipeline, may be determined.

Typically, control electronics (e.g., control electronics package 124) cause the transducers 222 to fire, receive the output of the transducers, compute the mean flow velocity for each chord, compute the mean flow velocity for the meter, compute the volumetric flow rate through the meter, and perform meter diagnostics. The volumetric flow rate and possibly other measured and computed values, such as flow velocity and speed of sound, are then output to additional devices, such as a flow computer, that are external to the meter 100.

FIGS. 5A and 5B show views of the ultrasonic transducer 222 in accordance with principles disclosed herein. FIG. 5A shows an end cross-sectional view of the transducer 222, and FIG. 5B shows a side cross-sectional view of the transducer 222. Each transducer of the ultrasonic flow meter 100 (e.g., transducer 222 of transducer assembly 108, 110, 112, 114, 116, 118, 120, 122) may be structurally similar or identical to transducer 222 as shown in FIGS. 5A and 5B. The ultrasonic transducer 222 includes an electrical/acoustical transducer 502, low-density epoxy 504, a reinforcing sleeve 506, and an outer case or housing 508. Electrical conductors 510 connect the electrical/acoustical transducer 502 through the cable 126 to the control electronic package 124, which transmits electrical signals to and receives electrical signals from the electrical/acoustical transducer 502. The electrical/acoustical transducer 502 is an active element that emits and receives sound energy. The electrical/acoustical transducer 502 may include a piezoelectric material such as lead zirconate titanate (PZT) and electrodes on the surface of the piezoelectric material. The electrodes are typically a thin layer of a conductive material such as silver or nickel. A voltage difference applied across the electrodes induces an electric field within the piezoelectric material that causes it to change shape and emit sound energy. Sound energy impinging on the piezoelectric material causes the piezoelectric material to change shape and develop a voltage between the electrodes.

The low-density epoxy 504 encapsulates, protects, and holds in place the electrical/acoustical transducer 502. The low-density epoxy 504 surrounds the electrical/acoustical transducer 502, and may substantially fill the inner passage of the housing 508. The electrical/acoustical transducer 502 is of relatively high density and the gas of the fluid stream flowing in the central passage 104 is of relatively low density. The low-density epoxy 504 also provides acoustical matching between the electrical/acoustical transducer 502 and the gas of the fluid stream. The epoxy is impregnated with glass bubbles 512 that reduce the density of the epoxy 504, thereby lowering the acoustic impedance of the epoxy.

The housing 508 is generally cylindrical in shape, and surrounds the low-density epoxy 504 and the electrical/acoustical transducer 502 embedded in the epoxy 504. The housing 508 is a rigid structure and can be formed of steel, aluminum, or other suitable material, preferably metal.

The low-density epoxy 504 and the electrical/acoustical transducer 502 have substantially different coefficients of thermal expansion. For example, the epoxy 504 may have a relatively large coefficient of thermal expansion while the electrical/acoustical transducer 502 may have a near zero or negative coefficient of thermal expansion.

The mismatch in coefficient of thermal expansion between the epoxy 504 and the electrical/acoustical transducer 502 can produce a large tensile stress in the epoxy at extreme cold temperatures (e.g., −50° Celsius). The tensile stress can cause the epoxy 504 to crack. Because the electrical/acoustical transducer 502 may be relatively brittle, as a crack in the epoxy 504 develops and reaches the electrical/acoustical transducer 502, the electrical/acoustical transducer 502 may crack with the epoxy 504. Cracking of the electrical/acoustical transducer 502 results in a loss of electrical and acoustic performance that may make the transducer 222 inoperable.

Embodiments of the ultrasonic transducer 222 reduce the issues associated with cracking of the epoxy 504 by including the reinforcing sleeve 506. The reinforcing sleeve 506 is embedded in the epoxy 504 and surrounds the electrical/acoustical transducer 502 reinforcing the structure of the transducer 222 without reducing transducer performance. The reinforcing sleeve 506 may be a cylinder or tube formed of braided fibers. The fibers may be glass, carbon, poly-para-phenylene terephthalamide, or other suitable material. Glass fibers may better match the mechanical properties of the electrical/acoustical transducer 502 than other materials. In some embodiments of the transducer 222, the reinforcing sleeve 506 includes relatively thin braided glass fiber threads, where each thread includes hundreds of glass fibers, and the threads are shaped to form a cylinder. Inclusion of the reinforcing sleeve 506 greatly improves the performance and operating life of the transducer 222 at extreme temperatures by reducing cracking in the low-density epoxy 504. The reinforcing sleeve 506 may not be in direct contact with the electrical/acoustical transducer 502. For example, a layer of epoxy 504 may separate the electrical/acoustical transducer 502 from the reinforcing sleeve 506. The front face 514 of the electrical/acoustical transducer 502 is exposed only to the low-density epoxy 504, not to the reinforcing sleeve 506. Accordingly, the acoustic performance of the transducer 222 is unchanged relative to transducers that lack the reinforcing sleeve 506.

In some embodiments, the reinforcing sleeve 506 is formed with a longitudinal ridge 602 as shown in FIGS. 6A and 6B. The longitudinal ridge 602 forms a passage for the conductors 510 that electrically connect the electrical/acoustical transducer 502 to the control electronic package 124. FIG. 6A shows an end view of the reinforcing sleeve 506. FIG. 6B shows an end view of the reinforcing sleeve 506 positioned relative to the housing 508 and the electrical/acoustical transducer 502 (before the inner passage of the housing 508 is filled with low-density epoxy). A conductor 510 passes through the channel formed by the longitudinal ridge 602 and is electrically connected to the electrical/acoustical transducer 502.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An ultrasonic flow meter, comprising:
    a central passage for flow of a fluid stream to be metered;
    a plurality of pairs of ultrasonic transducers, each pair of transducers configured to form a chordal path across the passage between the transducers, each of the transducers comprising:
        a piezoelectric crystal;
        low-density epoxy, comprising glass bubbles, encasing the piezoelectric crystal; and
        a cylindrical reinforcing sleeve embedded in the low-density epoxy, the sleeve comprising fiber mesh, and surrounding the piezoelectric crystal.

2. The ultrasonic flow meter of claim 1, wherein the low-density epoxy is formulated to acoustically match the piezoelectric crystal to the fluid stream.

3. The ultrasonic flow meter of claim 1, wherein the sleeve comprises interwoven glass fibers.

4. The ultrasonic flow meter of claim 1, wherein the sleeve comprises a woven fiberglass shell.

5. The ultrasonic flow meter of claim 1, wherein the sleeve comprises at least one of glass, carbon and poly-para-phenylene terephthalamide fibers.

6. The ultrasonic flow meter of claim 1, wherein the sleeve comprises a longitudinal ridge forming a channel for a conductor that electrically connects the piezoelectric crystal to a transducer driver.

7. The ultrasonic flow meter of claim 1, wherein the sleeve enables the transducers to operate without cracking at temperatures as low as −50 degrees Celsius.

8. An ultrasonic transducer for use in an ultrasonic flow meter, the transducer comprising:
- a piezoelectric crystal;
- low-density epoxy, comprising glass bubbles, encasing the piezoelectric crystal; and
- a cylindrical reinforcing sleeve embedded in the low-density epoxy, the sleeve comprising fiber mesh, and surrounding the piezoelectric crystal.

9. The ultrasonic transducer of claim 8, comprising a cylindrical rigid outer housing surrounding the low-density epoxy.

10. The ultrasonic transducer of claim 8, wherein the low-density epoxy is formulated to acoustically match the piezoelectric crystal to the fluid stream.

11. The ultrasonic transducer of claim 8, wherein the sleeve comprises interwoven glass fibers.

12. The ultrasonic transducer of claim 8, wherein the sleeve comprises a woven fiberglass shell.

13. The ultrasonic transducer of claim 8, wherein the sleeve comprises at least one of glass, carbon and poly-para-phenylene terephthalamide fibers.

14. The ultrasonic transducer of claim 8, wherein the sleeve comprises a longitudinal ridge forming a channel for a conductor that electrically connects the piezoelectric crystal to a transducer driver.

15. The ultrasonic transducer of claim 8, wherein the sleeve enables the transducer to operate without cracking at temperatures as low as −50 degrees Celsius.

16. An ultrasonic transducer, comprising:
- an electrical/acoustical transducer;
- low-density epoxy encasing the electrical/acoustical transducer, the low-density epoxy impregnated with glass bubbles; and
- a braided fiberglass reinforcing sleeve embedded in the low-density epoxy and surrounding the electrical/acoustical transducer.

17. The ultrasonic transducer of claim 16, further comprising a cylindrical rigid outer housing surrounding the low-density epoxy.

18. The ultrasonic transducer of claim 16, wherein the sleeve comprises a longitudinal ridge forming a channel for a conductor that electrically connects the electrical/acoustical transducer to a transducer driver.

* * * * *